(12) United States Patent
Ramappa et al.

(10) Patent No.: US 7,745,238 B2
(45) Date of Patent: Jun. 29, 2010

(54) MONITORING OF TEMPERATURE VARIATION ACROSS WAFERS DURING PROCESSING

(75) Inventors: Deepak A. Ramappa, Cambridge, MA (US); Rosa A. Orozco-Teran, Plano, TX (US); Laura Matz, Macungie, PA (US)

(73) Assignee: Texas Instruments Incorporated, Dallas, TX (US)

( * ) Notice: Subject to any disclaimer, the term of this patent is extended or adjusted under 35 U.S.C. 154(b) by 201 days.

(21) Appl. No.: 12/037,531

(22) Filed: Feb. 26, 2008

(65) Prior Publication Data

US 2009/0215203 A1 Aug. 27, 2009

(51) Int. Cl.
G01R 31/26 (2006.01)
H01L 21/66 (2006.01)
(52) U.S. Cl. ........... 438/14; 257/E21.521; 257/E21.529
(58) Field of Classification Search .................. 438/14; 257/E21.521, E21.525, E21.529
See application file for complete search history.

(56) References Cited

U.S. PATENT DOCUMENTS 6,569,691 B1* 5/2003 Jastrzebski et al. ............ 438/14
2008/0118424 A1* 5/2008 Sadamitsu et al. .......... 423/324

* cited by examiner

*Primary Examiner*—Alexander G Ghyka
*Assistant Examiner*—Abdulfattah Mustapha
(74) *Attorney, Agent, or Firm*—Warren L. Franz; Wade J. Brady, III; Frederick J. Telecky, Jr.

(57) ABSTRACT

A method of measuring temperature across wafers during semiconductor processing includes the step of providing a correlation between a peak wafer temperature during a processing step and a change in wafer surface charge or surface potential following the processing step. A first wafer to be characterized for its peak temperature spatial distribution during the processing step is processed through the processing step. The wafer surface charge or surface potential at a plurality of locations on the first wafer are measured following the processing step. A peak temperature spatial distribution for the first wafer is then determined based on the correlation and the wafer surface charge or surface potential measured in the measuring step.

22 Claims, 4 Drawing Sheets

MONITORING OF TEMPERATURE VARIATION ACROSS WAFERS DURING PROCESSING

FIELD OF THE INVENTION

The present invention relates to the manufacture of semiconductor devices; and, in particular, to systems and methods for monitoring temperature variation across wafers.

BACKGROUND

Wafer temperature is known to be an important processing parameter in the manufacture of semiconductor devices. Wafer temperature variation can be both wafer-to-wafer (e.g. in a batch process) and across a given wafer, whether in a batch process or not. Temperature variation is known to introduce non-uniformities in processing parameters, such as etch rate, deposition rate, plasma density, grain growth, and doping levels, across a wafer. Such non-uniformities can reduce yield by resulting in widened distributions for devices formed even within a given die, such as for dimensions and parametric values like voltage thresholds and resistance values. There is thus a need to detect and monitor process temperature variation across wafers during processing to allow improved process control and for more robust process development. The method should be rapid, provide high spatial resolution, and not require expensive equipment.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A method of measuring temperature across wafers during semiconductor processing comprises providing a correlation between a peak wafer temperature during a processing step and the change in wafer surface charge or surface potential following the processing step. The wafer surface charge and surface potential are related quantities. Specifically, the surface charge density in combination with the dielectric properties including the interface trap densities results in the surface potential at the dielectric. There is a small contribution of the wafer substrate doping that may generally be considered negligible and constant for methods according to the invention.

The change in wafer surface charge or surface potential following the processing step is found by subtracting the wafer surface charge or surface potential before the processing step from the measured wafer surface charge or surface potential after the processing step. The pre-processing value can be determined from a pre-process measurement. However, in other embodiments of the invention the wafer surface charge or surface potential before the processing step is treated as a constant (e.g. for standardize wafers having a given dielectric (e.g. oxide) stack) so that pre-measurement of wafer surface charge or surface potential is not required.

A first wafer to be characterized for its peak temperature spatial distribution during the processing step is processed through the processing step. Following the processing step the wafer surface charge or surface potential is measured at a plurality of locations on the first wafer. The peak temperature spatial distribution for the first wafer is then determined based on the correlation and a change in the measured wafer surface charge or surface potential value resulting from the processing step. In one embodiment, the providing a correlation comprises processing a thermocouple comprising wafer having a plurality of thermocouples coupled thereto and a control wafer through the processing step, wherein the thermocouple comprising wafer and the control wafer both comprise a particular dielectric or semiconductor layer stack.

The particular layer can comprise a dielectric layer having a thickness between 20 nm and 300 nm. In one embodiment the dielectric layer can comprise a silicon oxide, such as a deposited TEOS-based oxide.

The thermocouple comprising wafer can include a structure for storing temperature data from the thermocouples and a processor, wherein the structure for storing is coupled to the processor. The thermocouple comprising wafer and the control wafer can both be processed together during the processing step.

The processing step can comprise a variety of processing steps including a clean, a wet etch, a dry etch, or a sputtering process. The correlation can comprise a quadratic relationship, wherein the peak wafer temperature is related to a square of the change in wafer surface potential. In one embodiment the peak temperature spatial distribution can comprise at least 100 temperature data points on the first wafer. The measuring step can comprise a corona discharge for biasing a surface of the first wafer.

DETAILED DESCRIPTION

Figure 1:
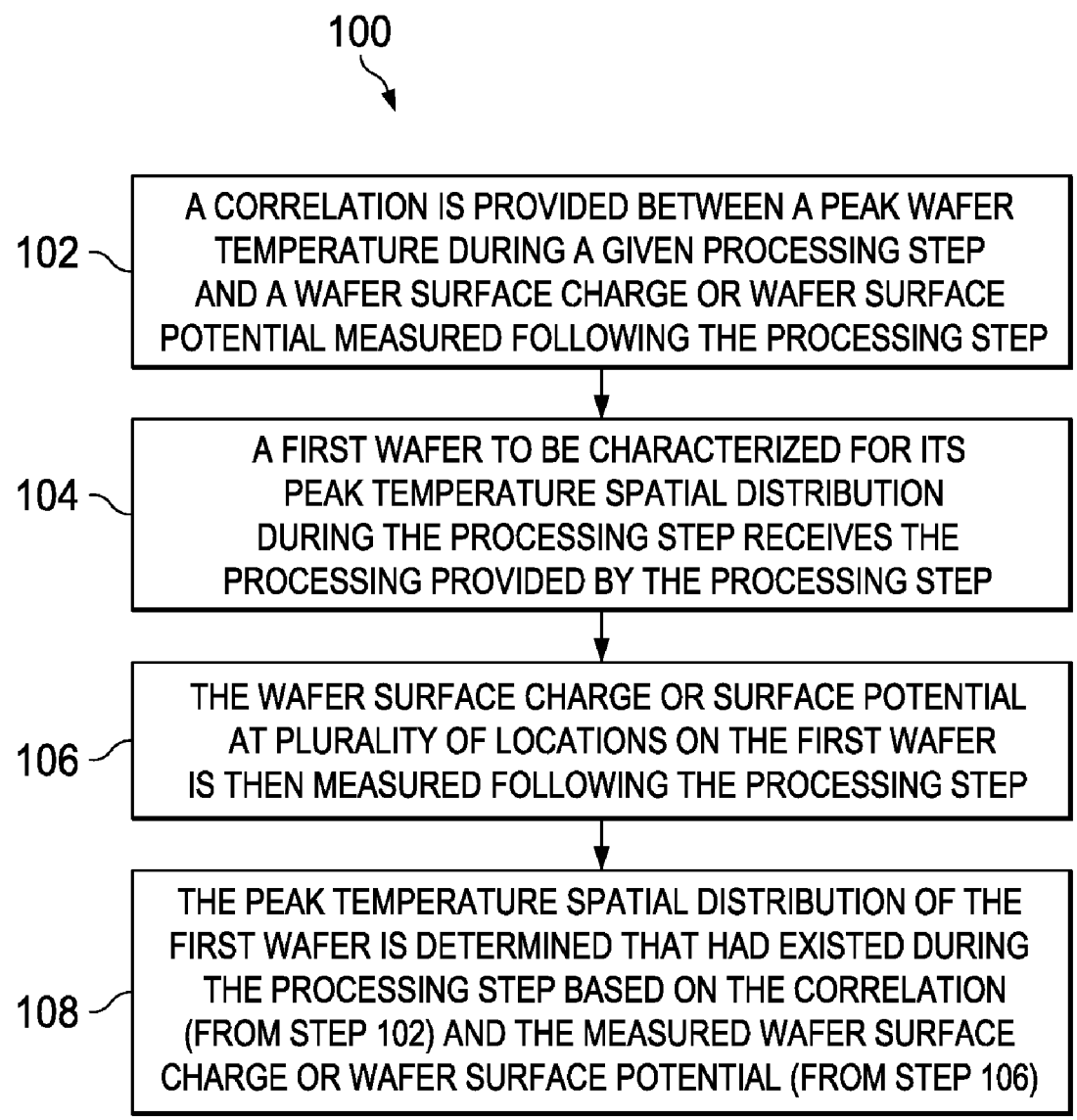
FIG. 1 shows steps in an exemplary method according to an embodiment of the invention for detecting peak wafer temperature across the wafer that was present during a semiconductor processing step.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

It was discovered by the present inventors that the change in wafer surface charge and/or change in wafer surface potential can be correlated with the peak temperature reached by a wafer during a given processing step, referred to herein as the "peak wafer temperature". Once a correlation is established, measurement of wafer surface charge or surface potential at a plurality of locations on the wafer (e.g. a wafer map) can be used to determine the corresponding peak temperatures that existed during the processing step at the plurality of positions across the wafer. The correlation can comprise an equation or other function relating the magnitude of the change in wafer charge (charge per unit area) or change in wafer surface potential (typically expressed in Volts) resulting from the processing step and the peak wafer temperature during the processing step. Surface charge or surface potential at a plurality of locations on the wafer (e.g. a wafer map) can thus be used to determine the change in surface charge or surface potential at a plurality of locations on the wafer (e.g., from a pre-processing measurement or a constant value for surface charge or surface potential), and the change surface charge or surface potential can then be used to determine the corresponding temperature at the plurality of locations. In addition, regions around those locations can be interpolated or otherwise approximated to allow peak wafer temperature characterization for entire wafers.

FIG. 1 shows steps in an exemplary method 100 for detecting peak wafer temperature across the wafer during a semiconductor processing step. The process step can comprise a clean, a wet etch, a dry etch, CMP, sputter, a doping step, an annealing step, a deposition or other step. In step 102, a correlation is provided between a peak wafer temperature during the processing step and a change in wafer surface charge or wafer surface potential measured following the processing step. As described below in more detail, generating a correlation can comprise processing together a thermocouple comprising wafer having a plurality of thermocouples coupled thereto and a control wafer through the processing step, wherein the thermocouple comprising wafer and the control wafer both comprise a particular layer stack (e.g. a dielectric layer or dielectric stack having a certain thickness).

In step 104, a first wafer to be characterized for its peak temperature spatial distribution during the processing step receives the processing provided by the processing step. Following the processing step, the wafer surface charge or surface potential at a plurality of locations on the first wafer is then measured in step 106. In step 108, the peak temperature spatial distribution of the first wafer is determined that had existed during the processing step based on the correlation (from step 102) and the change in wafer surface charge or wafer surface potential (from measurements obtained at step 106). The peak temperature spatial distribution can be presented in a number of different formats, such as a plurality of discrete points or as a wafer map that represents peak temperature over essentially the entire wafer surface.

Wafer surface charge or surface potential can be measured by a variety of commercially available systems. For example, the PDM FAaST2000 system from Semiconductor Diagnostics Inc. (SDI, Tampa, Fla.) or QUANTOX™ system from KLA-Tencor (San Jose, Calif.) can be used. The PDM (SDI) or the QUANTOX™ (KLA-Tencor) systems are non-contact metrology tools capable of characterizing the electrical properties of both dielectrics and semiconductors such as silicon. Such tools provide users (e.g. process engineers) with electrical test data without the need for metallization or other processing. The methods combine three non-contacting techniques to generally perform the measurement functions. A corona discharge is used to bias the wafer surface and emulate the function of a metal/oxide/semiconductor (MOS) electrical contact. A vibrating Kelvin probe measures the wafer surface potential as a function of surface charge. Although not generally required for embodiments of the invention, this tool also includes a pulsed light source linked to the Kelvin probe to enable the stimulus and detection of surface photovoltage, which, in turn, can provide additional information on silicon or other semiconductor bandbending.

One way to establish a correlation for a given process is for the process to be monitored on both a control wafer and a thermocouple comprising wafer having embedded or otherwise coupled thermocouples. Wafers having built-in thermocouples are generally commercially available. These respective wafers generally have the same surface layers having comparable thicknesses, such as one or more dielectric or semiconductor layers. The thermocouple comprising wafer generally includes a plurality of structures for storing temperature data from the thermocouples, such as a non-volatile memory coupled to a processor (See FIG. 3C described below). Generally, a different thermocouple comprising wafer and control wafer (e.g. different layer stack) is needed for each different process monitored to reflect the nominal layer stack that enters the processing tool being monitored.

In one embodiment, the process is simultaneously performed on both of these wafers. For example, the respective thermocouple comprising wafer and control wafer are etched or cleaned together. Following processing, wafer surface temperature readings from the respective thermocouples can be obtained from the data stored on the thermocouple comprising wafer. Wafer surface temperature contours expressing estimates for the temperature across the entire wafer can be generated from the thermocouple readings. After processing the control wafer, a wafer surface potential map can then be generated from the control wafer, such as by using the SDI-PDM or the QUANTOX™ system described above. Both of these systems include using a part of the wafer, such as using the notch or wafer flat, for alignment so that angular parametric variation can be accounted for and measured.

Figure 4:
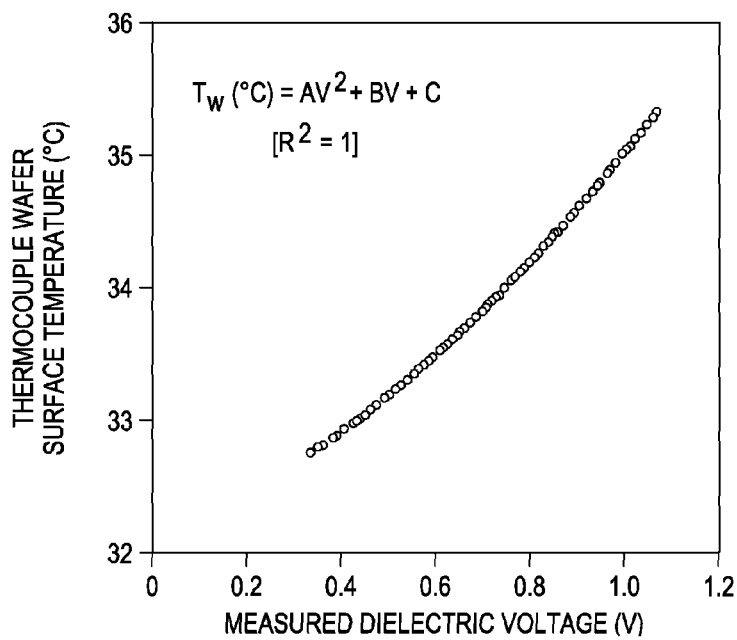
FIG. 4 shows a parabolic relationship established by combining data from the change in surface dielectric voltage from the processed control wafer and the wafer surface temperature obtained from measurements provided by the processed thermocouple embedded wafer, according to an embodiment of the invention. The equation is a parabolic equation which expresses wafer surface temperature (Tw) in a second order relation relative to the change in surface dielectric voltage (V).

Based on a point-by-point overlay of the temperature and wafer surface potential data, a correlation between peak wafer surface temperature during the process and the measured wafer surface potential can be generated. One relationship, a quadratic relationship, is shown in FIG. 4 and described below in the Examples section. The relationship shown is a parabolic relationship for a process comprising a post-etch clean performed on a silicon wafer having a TEOS coated surface. The oxide was about 100 nm thick. The dielectric (e.g. silicon oxide) thickness generally needs to be in the range 20 nm-300 nm. Thinner oxides tend to be leaky which can lead to errors in measurement. Thicker oxides will generally have deposition non-uniformities and hence can contribute to errors in evaluation. Different processes are expected to provide different relationships between wafer surface temperature and the change in wafer surface charge or surface potential.

One significant advantage of embodiments of the invention is being able to monitor spatial wafer temperature variations during processing. No new special equipment is generally required. The same general method can be used to monitor temperature variation for a variety of process steps as described above. The same process control (PC) wafer can be used to generate the wafer surface potential measurements. The same stack can be used for multiple processes. For example, in one embodiment of the invention a 100 nm oxide layer is used as a standard. Thousands of points of information are possible thus providing high spatial resolution if desired. The method is generally rapid, such as a measurement time of about 15 minutes for a 3,000 point map in one embodiment. The method and the measured wafer surface potential parameter can be conveniently monitored inline (performing the method in a clean-room environment in between various process methods in the process fabrication line of an integrated circuit), without the need for additional processing steps (e.g. metallization). The methods can be used for detection of tool diversions (e.g. drifts) as well as equipment malfunctions. Multiple tools that provide the same function can be measured and the processing differences minimized by implementing process changes based on measurements provided by the invention. In addition, the invention does not result in equipment contamination issues.

EXAMPLE

Figure 2:
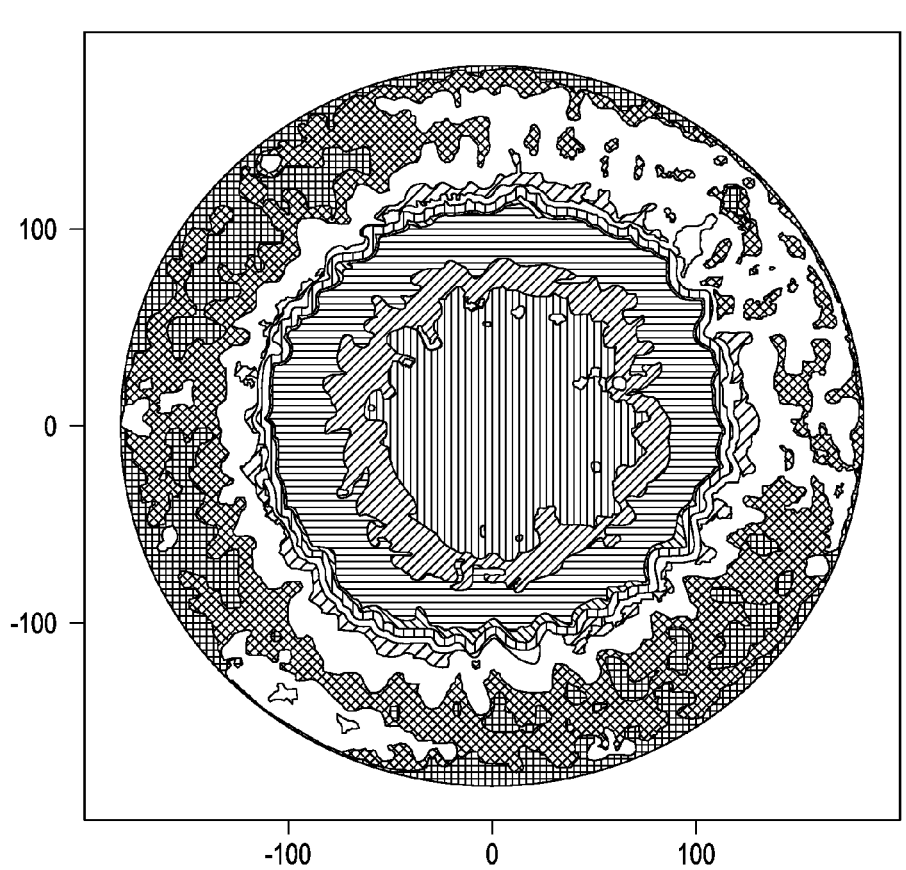
FIG. 2 shows a scanned image of wafer surface contours measured using a processed control wafer along with corresponding surface dielectric voltage that was measured after processing, according to an embodiment of the invention.
Figure 2:
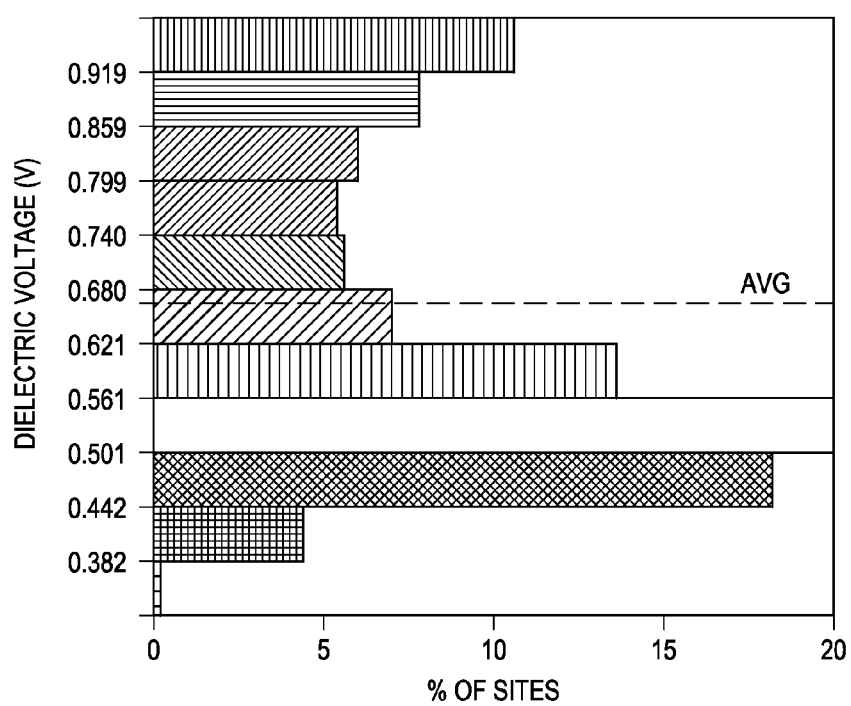
Figure 3A:
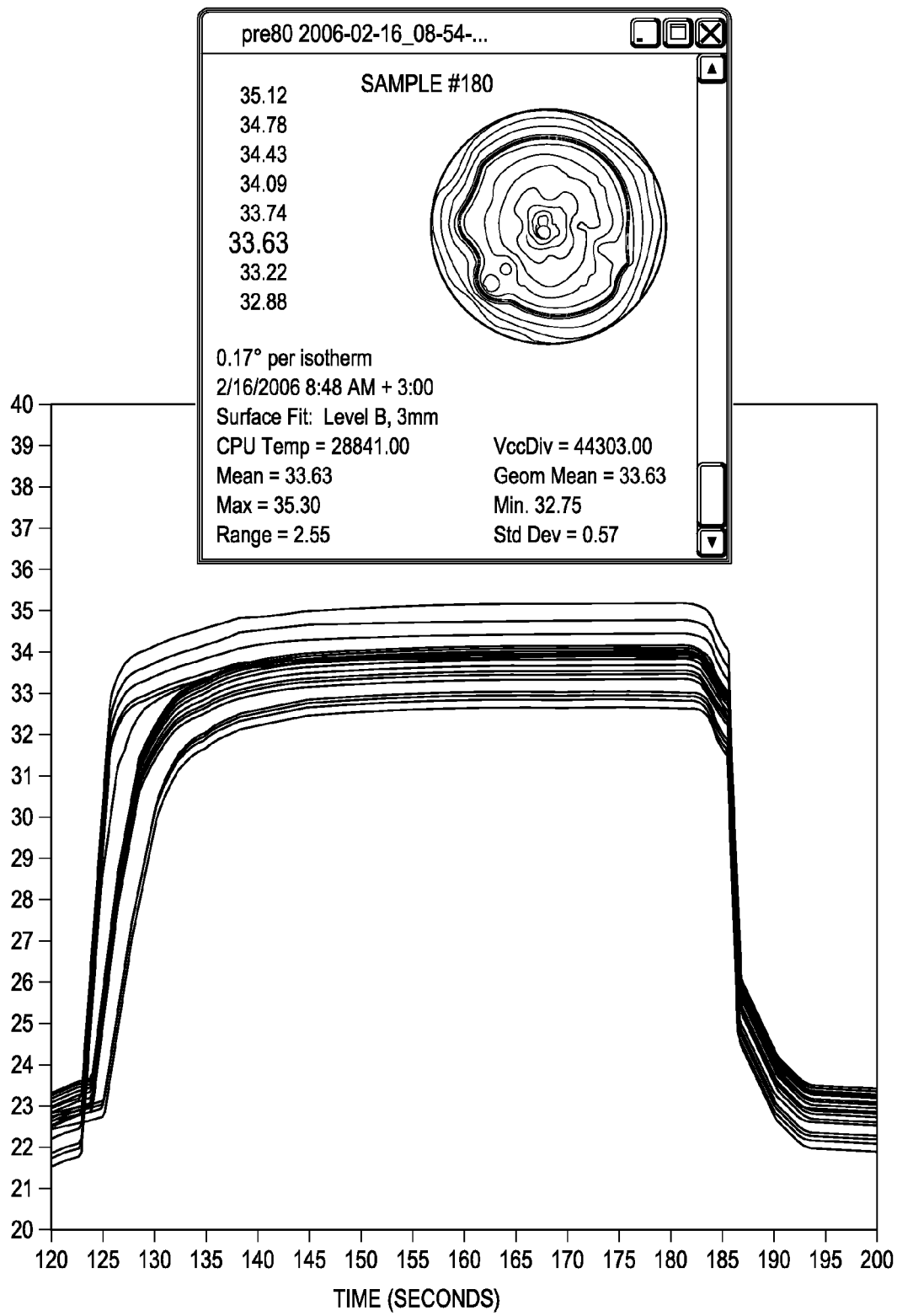
FIG. 3A shows measured wafer surface temperature provided by a thermocouple embedded wafer.
Figure 3B:
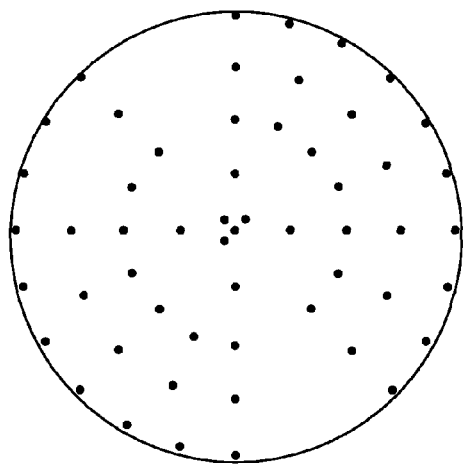
FIG. 3B exemplary thermocouple locations on the wafer, and FIG. 3C a block diagram representation of a block diagram representation of exemplary circuitry for coupling to thermocouples on the thermocouple embedded wafer.
Figure 3C:
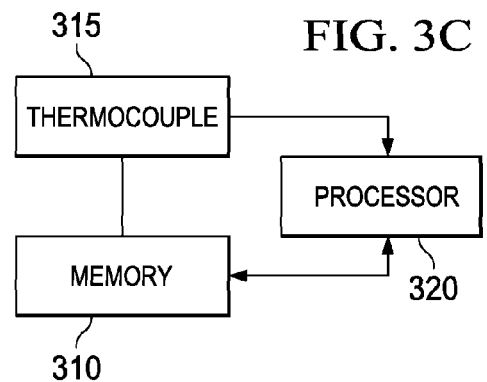

The processing step used in the Example described below was a two (2) minute post-etch clean. The clean was performed on a control wafer comprising a silicon wafer having about a 100 nm TEOS/ultra-low k (ULK) coated surface at the same time as on a thermocouple embedded wafer as described above having the same TEOS/ULK coated surface. Following the post-etch clean processing, a wafer surface potential map for the control wafer was determined using an SDI-FAaST2000™ system from Semiconductor Diagnostics, Inc. FIG. 2 shows a scanned image of wafer surface contours measured using the processed control wafer along with corresponding measured surface dielectric voltages which were found to be in a range of from about 0.382 V to 0.919V. The wafer surface temperature was also measured using the post-etch clean processed thermocouple embedded wafer. Temperature results obtained from the thermocouple embedded wafer are shown in FIG. 3A. The temperature data can be seen to be within a range of from 22° C. to about 34° C. FIG. 3B shows exemplary thermocouple locations on the wafer used, and FIG. 3C shows a block diagram representation of exemplary circuitry for coupling to the thermocouple 315, the circuitry comprising memory 310 and processor 320.

FIG. 4 shows a parabolic relationship established by combining data from the surface dielectric voltage from the control wafer and the wafer surface temperature measured by the thermocoupled comprising wafer. The equation is a parabolic equation which expresses wafer surface temperature as a second order relationship relative to the change in surface dielectric voltage (V).

Although the invention has been illustrated and described with respect to one or more implementations, equivalent alterations and modifications will occur to others skilled in the art upon the reading and understanding of this specification and the annexed drawings. In particular regard to the various functions performed by the above-described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method of measuring temperature across wafers during semiconductor processing, comprising:
    providing a correlation between a peak wafer temperature during a processing step and change in wafer surface charge or surface potential following said processing step;
    processing a first wafer to be characterized for its peak temperature spatial distribution during said processing step through said processing step;
    measuring said wafer surface charge or surface potential at a plurality of locations on said first wafer following said processing step, and
    determining said peak temperature spatial distribution for said first wafer based on said correlation and said wafer surface charge or surface potential measured in said measuring step.

2. The method of claim 1, wherein said providing a correlation comprises processing a thermocouple comprising wafer having a plurality of thermocouples coupled thereto and a control wafer through said processing step, wherein said thermocouple comprising wafer and said control wafer both include a particular layer of material.

3. The method of claim 2, wherein said particular layer of material comprises a dielectric layer having a thickness between 20 nm and 300 nm.

4. The method of claim 3, wherein said dielectric layer comprises silicon oxide.

5. The method of claim 2, wherein said thermocouple comprising wafer includes a structure for storing temperature data from said thermocouples and a processor, said structure for storing coupled to said processor.

6. The method of claim 2, wherein said thermocouple comprising wafer and said control wafer are both processed together during said processing step.

7. The method of claim 1, wherein said processing step comprises at least one of a clean; a wet etch; a dry etch; or a sputtering.

8. The method of claim 1, wherein said correlation comprises a quadratic relationship, wherein said peak wafer temperature is related to a square of said change in wafer surface potential.

9. The method of claim 1, wherein said peak temperature spatial distribution comprises at least 100 temperature data points on said first wafer.

10. The method of claim 1, wherein said measuring comprises a corona discharge for biasing a surface of said first wafer.

11. A method of measuring temperature across wafers during semiconductor processing, comprising:
    processing a thermocouple comprising wafer having a plurality of thermocouples coupled thereto and a control wafer together through a processing step to establish a correlation between a peak wafer temperature during said processing step and a change in wafer surface charge or surface potential measured following said processing step;

processing another wafer through said processing step;

measuring surface charge or surface potential at a plurality of locations on said another wafer following said processing step, and determining said peak temperature spatial distribution for said another wafer based on said correlation and said wafer surface charge or surface potential measured at said plurality of locations in said measuring step.

12. The method of claim 11, wherein said thermocouple comprising wafer includes a structure for storing temperature data from said thermocouples and a processor, said structure for storing coupled to said processor.

13. The method of claim 11, wherein said thermocouple comprising wafer and said control wafer both include a particular layer stack comprising a dielectric layer having a thickness between 20 nm and 300 nm.

14. The method of claim 13, wherein said dielectric layer comprises silicon oxide.

15. The method of claim 11, wherein said processing step comprises at least one of a clean; a wet etch; a dry etch; or a sputtering.

16. A method of measuring temperature across wafers during semiconductor processing, comprising:

processing a thermocouple comprising wafer and a control wafer together through a processing step, the thermocouple comprising wafer including a plurality of thermocouples at a plurality of locations thereon, and the control wafer having initial wafer surface charges or surface potentials at a corresponding plurality of locations;

measuring peak temperatures during said processing step for said plurality of locations of said thermocouple comprising wafer using said thermocouples;

following said processing step, measuring changes in wafer surface charges or surface potentials for said corresponding plurality of locations of said control wafer;

establishing a correlation between said measured peak temperatures for said plurality of locations and said measured changes in wafer surface charges or surface potentials for said corresponding plurality of locations;

processing another wafer through said processing step;

following processing said another wafer through said processing step, measuring changes in wafer surface charges or surface potentials for another corresponding plurality of locations of said another wafer;

determining a spatial distribution of peak temperatures during said processing step for said another wafer, based on said established correlation and said measured changes in wafer surface charges or surface potentials at said another corresponding plurality of locations.

17. The method of claim 16, wherein said thermocouple comprising wafer, said control wafer and said another wafer all include a same dielectric or semiconductor layer stack.

18. The method of claim 17, wherein said stack comprises a dielectric layer having a thickness between 20 nm and 300 nm.

19. The method of claim 18, wherein said dielectric layer comprises silicon oxide.

20. The method of claim 18, wherein said dielectric layer comprises TEOS.

21. The method of claim 16, wherein said processing step comprises at least one of a clean, a wet etch, a dry etch, or a sputtering process.

22. The method of claim 16, wherein said thermocouple comprising wafer, said control wafer and said another wafer each includes a dielectric stack; and establishing a correlation comprises expressing wafer surface temperature in a second order relation relative to a change in surface dielectric voltage.

* * * * *